(12) United States Patent
Laconde et al.

(10) Patent No.: US 11,296,071 B2
(45) Date of Patent: Apr. 5, 2022

(54) DEVICE OF PROTECTION AGAINST ELECTROSTATIC DISCHARGES

(71) Applicant: STMicroelectronics (Tours) SAS, Tours (FR)

(72) Inventors: Eric Laconde, Tours (FR); Olivier Ory, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 16/834,499

(22) Filed: Mar. 30, 2020

(65) Prior Publication Data

US 2020/0321329 A1 Oct. 8, 2020

(51) Int. Cl.
*H01L 27/02* (2006.01)
*H01L 27/08* (2006.01)

(52) U.S. Cl.
CPC ...... *H01L 27/0255* (2013.01); *H01L 27/0814* (2013.01)

(58) Field of Classification Search
None
See application file for complete search history.

(56) References Cited

U.S. PATENT DOCUMENTS

| 6,960,792 | B1 | 11/2005 | Nguyen | |
| 8,431,959 | B2* | 4/2013 | Davis | H01L 27/0255 257/173 |
| 8,953,290 | B2* | 2/2015 | Ory | H01L 23/62 361/56 |
| 2005/0012156 | A1* | 1/2005 | Yeh | H01L 27/0255 257/367 |
| 2008/0116480 | A1 | 5/2008 | Glenn et al. | |
| 2009/0032837 | A1 | 2/2009 | Tseng et al. | |
| 2009/0032838 | A1 | 2/2009 | Tseng et al. | |
| 2009/0079001 | A1* | 3/2009 | Salih | H01L 27/0255 257/355 |
| 2013/0153957 | A1 | 6/2013 | Lin et al. | |
| 2015/0364462 | A1* | 12/2015 | Nakaiso | H01L 27/0292 257/751 |

(Continued)

FOREIGN PATENT DOCUMENTS

| CN | 106206569 A | 12/2016 |
| CN | 108630680 A | 10/2018 |
| KR | 20180086789 A | 8/2018 |

OTHER PUBLICATIONS

INPI Search Report and Written Opinion for FR 1903658 dated Nov. 22, 2019 (8 pages).

*Primary Examiner* — Steven M Christopher
(74) *Attorney, Agent, or Firm* — Crowe & Dunlevy

(57) ABSTRACT

A device of protection against electrostatic discharges is formed in a semiconductor substrate of a first conductivity type that is coated with a semiconductor layer of a second conductivity type. A buried region of the second conductivity type is positioned at an interface between the semiconductor substrate and the semiconductor layer. First and second wells of the first conductivity type are formed in the semiconductor layer and a region of the second conductivity type is formed in the second well. A stop channel region of the second conductivity type is provided in the semiconductor layer to laterally separating the first well from the second well, where no contact is present between this stop channel region and either of the first and second wells.

21 Claims, 3 Drawing Sheets

(56) References Cited

U.S. PATENT DOCUMENTS

| | | | |
|---|---|---|---|
| 2015/0371941 A1* | 12/2015 | Nakaiso | H01L 23/528 |
| | | | 257/499 |
| 2016/0261110 A1 | 9/2016 | Ivonov et al. | |
| 2017/0077082 A1* | 3/2017 | Marreiro | H01L 27/0262 |
| 2020/0051968 A1* | 2/2020 | Willemen | H01L 29/408 |
| 2020/0381424 A1* | 12/2020 | Shukla | H01L 27/0248 |

* cited by examiner

DEVICE OF PROTECTION AGAINST ELECTROSTATIC DISCHARGES

PRIORITY CLAIM

This application claims the priority benefit of French Application for Patent No. 1903658, filed on Apr. 5, 2019, the content of which is hereby incorporated by reference in its entirety to the maximum extent allowable by law.

TECHNICAL FIELD

The present disclosure generally relates to electronic circuits and, more particularly, concerns a device of protection of an electronic circuit against electrostatic discharges.

BACKGROUND

Devices of protection of electronic circuits against electrostatic discharges, comprising lateral thyristors to dissipate overvoltages due to electrostatic discharges, are known in the art.

Known structures of devices of protection against electrostatic discharges based on lateral thyristors, however, have various disadvantages.

It would be desirable to at least partly overcome some of these disadvantages.

SUMMARY

In an embodiment, a device of protection against electrostatic discharges, comprises: a semiconductor substrate of a first conductivity type coated with a semiconductor layer of the second conductivity type; at the interface between the substrate and the semiconductor layer, a buried region of the second conductivity type having a doping level greater than that of the semiconductor layer; first and second wells of the first conductivity type formed in the semiconductor layer on the side of its surface opposite to the substrate; a region of the second conductivity type formed in the second well on the side of its surface opposite to the substrate; and a first stop channel region of the second conductivity type having a doping level greater than that of the semiconductor layer, formed in the semiconductor layer on the side of its surface opposite to the substrate and laterally separating the first and second wells, wherein the first well is connected to a first connection terminal of the device and the second well and the region of the second conductivity type formed in the second well are connected to a second connection terminal of the device.

According to an embodiment, in top view, the first stop channel region totally surrounds each of the first and second wells.

According to an embodiment, the device comprises a first vertical insulating wall surrounding, in top view, the first stop channel region and the first and second wells, the first insulating wall extending across the entire thickness of the semiconductor layer and of the buried layer.

According to an embodiment, the device further comprises, in a portion of the device which does not comprise the buried region, a second vertical insulating wall laterally delimiting a first diode defined by the junction between the substrate and the semiconductor layer.

According to an embodiment, the portion of the semiconductor layer laterally delimited by the second vertical insulating wall is connected to the second connection terminal of the device via a contacting area.

According to an embodiment, the portion of the semiconductor layer laterally delimited by the second vertical insulating wall is connected to the first connection terminal of the device via a contacting area, and wherein the substrate is connected to the second connection terminal of the device.

According to an embodiment, the device further comprises: third and fourth wells of the first conductivity type formed in the semiconductor layer on the side of its surface opposite to the substrate; a region of the second conductivity type formed in the fourth well on the side of its surface opposite to the substrate; and a second stop channel region of the second conductivity type having a doping level greater than that of the semiconductor layer, formed in the semi-conductor layer on the side of its surface opposite to the substrate and laterally separating the third and fourth wells, the third well being connected to the second connection terminal of the device and the fourth well and the region of the second conductivity type formed in the fourth well being connected to the first connection terminal of the device.

According to an embodiment, in top view, the second stop channel region totally surrounds each of the third and fourth wells.

According to an embodiment, the device further comprises a third vertical insulating wall surrounding, in top view, the second stop channel region and the third and fourth wells, the third insulating wall extending across the entire thickness of the semiconductor layer and of the buried layer.

According to an embodiment, the device further comprises a region of the second conductivity type formed in the first well on the side of its surface opposite to the substrate, the region of the second conductivity type formed in the first well being connected to the first connection terminal of the device.

According to an embodiment, the device further comprises, in a portion of the device which does not comprise the buried region, a fourth vertical insulating wall laterally delimiting a second diode defined by the junction between the substrate and the semiconductor layer.

According to an embodiment, the portion of the semiconductor layer laterally delimited by the fourth vertical insulating wall is connected to the first connection terminal of the device via a contacting area.

BRIEF DESCRIPTION OF THE DRAWINGS

The foregoing and other features and advantages will be discussed in detail in the following non-limiting description of specific embodiments in connection with the accompanying drawings wherein.

DETAILED DESCRIPTION

Figure 1:
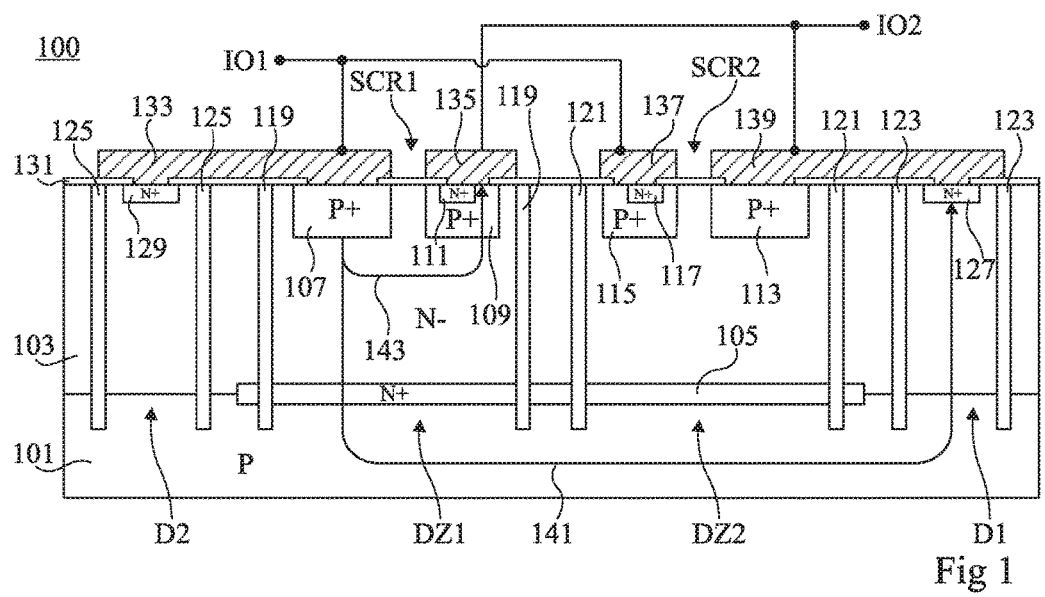
FIG. 1 is a simplified cross-section view of an example of a device of protection against electrostatic discharges.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the electronic circuits capable of being protected by the described protection devices have not been detailed, the described embodiments being compatible with usual electronic circuits requiring a protection against electrostatic discharges.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings, it being understood that, in practice, the described devices may be oriented differently.

The terms "about", "substantially", and "approximately" are used herein to designate a tolerance of plus or minus 10%, preferably of plus or minus 5%, of the value in question.

FIG. 1 is a simplified cross-section view of an example of a device 100 of protection of an electronic circuit (not shown) against electrostatic discharges.

Device 100 is, for example, a discrete monolithic component distinct from the circuit to be protected, comprising at least two connection terminals configured to be respectively connected to two distinct connection terminals of the circuit to be protected.

In the example of FIG. 1, device 100 comprises two connection terminals IO1 and 102 configured to be respectively connected to two distinct connection terminals of the circuit to be protected. Device 100 of FIG. 1 is a bidirectional protection device, that is, it is capable of dissipating positive and negative overvoltages that may occur between its terminals IO1 and IO2, and it is intended, in normal operation (in the absence of overvoltage), to receive positive and negative voltages between its terminals IO1 and IO2.

Device 100 comprises a P-type doped semiconductor substrate 101, for example, a silicon substrate.

Device 100 further comprises a lightly-doped N-type layer 103, for example, an epitaxial layer, coating the upper surface of substrate 101. Layer 103 for example extends over the entire upper surface of substrate 101.

Device 100 further comprises a heavily-doped N-type buried region 105 arranged at the interface between substrate 101 and layer 103. In this example, region 105 extends in an upper portion of substrate 101 and in a lower portion of layer 103. Region 105 is, for example, formed by implantation of N-type dopant elements on the front surface side of substrate 101, before the step of epitaxial growth of layer 103. In the shown example, region 105 is laterally located, that it, it does not extend over the entire surface of substrate 101. In the shown example, region 105 is located in a central portion of the device (with lateral portions of layer 103 in contact with corresponding lateral portions of layer 101).

Device 100 further comprises a first lateral thyristor SCR1 comprising two local P-type wells 107 and 109 formed in an upper portion of layer 103 and a local N-type region 111 formed in an upper portion of well 109. In this example, wells 107 and 109 are separated from each other by a portion of well 103. Each well extends vertically from the upper surface of layer 103 across a thickness smaller than the thickness of layer 103. Wells 107 and 109, for example, substantially have the same depth and the same doping level. In this example, wells 107 and 109 are arranged opposite (vertically in line with) buried region 105. Region 111 extends laterally over a portion only of the surface of well 109, and extends vertically from the upper surface of well 109, across a thickness smaller than the thickness of well 109. Lateral thyristor SCR1 is a PNPN-type thyristor formed by P-type well 107, layer 103, P-type well 109, and N-type region 111. The anode region of thyristor SCR1 corresponds to P-type well 107 and the cathode region of thyristor SCR1 corresponds to N-type region 111.

Device 100 further comprises a second lateral thyristor SCR2 comprising two local P-type wells 113 and 115 formed in an upper portion of layer 103, and a local N-type region 117 formed in an upper portion of well 115. In this example, wells 113 and 115 are separate and distinct from wells 107 and 109, and well 113 is separate from well 115 by a portion of layer 103. Each of wells 113 and 115 extends vertically from the upper surface of layer 103 across a thickness smaller than the thickness of layer 103. Wells 113 and 115, for example, substantially have the same depth and the same doping level as wells 107 and 109. In this example, wells 113 and 115 are arranged opposite (vertically in line) buried region 105. Region 117 extends laterally over a portion only of the surface of well 115, and extends vertically from the upper surface of well 115, across a thickness smaller than the thickness of well 115. Region 117, for example, substantially has the same depth and the same doping level as region 111. Lateral thyristor SCR2 is a PNPN-type thyristor formed by P-type well 113, layer 103, P-type well 115, and N-type region 117. The anode region of thyristor SCR2 corresponds to P-type well 113 and the cathode region of thyristor SCR2 corresponds to N-type region 117.

In this example, thyristor SCR1 is totally laterally surrounded with a first vertical insulating wall 119, and thyristor SCR2 is totally laterally surrounded with a second vertical insulating wall 121. Each of insulating walls 119 and 121 laterally separates thyristor SCR1 from thyristor SCR2. Insulating walls 119 and 121 are, for example, made of silicon oxide. In this example, each of insulating walls 119 and 121 extends vertically from the upper surface of layer 103, crosses the entire thickness of layer 103 and of region 105, and stops within (but does not pass completely through) substrate 101. In this example, buried region 105 extends laterally under the entire lower surface of the portion of layer 103 laterally delimited by insulating wall 119, and all over the lower surface of the portion of layer 103 delimited by insulating wall 121.

The portion of buried region 105 laterally delimited by insulating wall 119 forms with substrate 101 a PN junction defining a first Zener diode DZ1. The anode region of Zener diode DZ1 is formed by substrate 101 and the cathode region of Zener diode DZ1 is formed by the portion of region 105 laterally delimited by insulating wall 119. Similarly, the portion of buried region 105 laterally delimited by insulating wall 121 forms with substrate 101 a PN junction defining a second Zener diode DZ2. The anode region of Zener diode DZ2 is formed by substrate 101 and the cathode region of Zener diode DZ2 is formed by the portion of region 105 laterally surrounded by insulating wall 121.

Device 100 further comprises, in a peripheral region where buried region 105 is not present, a first diode D1 defined by the PN junction between substrate 101 and layer 103. Diode D1 is laterally surrounded with a vertical insulating wall 123, for example, of same nature as insulating walls 119 and 121. Wall 123 laterally separates diode D1 from thyristors SCR1 and SCR2. In this example, insulating wall 123 extends vertically from the upper surface of layer 103, crosses the entire thickness of layer 103, and stops within substrate 101. The anode region of diode D1 is formed by substrate 101 and the cathode region of diode D1 is formed by the portion of layer 103 laterally surrounded by insulating wall 123.

Device 100 further comprises, in a peripheral region where buried region 105 is not present, a second diode D2 defined by the PN junction between substrate 101 and layer 103. Diode D2 is laterally surrounded with a vertical insulating wall 125, for example, of same nature as insulating walls 119, 121, and 123. Wall 125 laterally separates diode D2 from thyristors SCR1 and SCR2 and from diode D1. In this example, insulating wall 125 extends vertically from the upper surface of layer 103, crosses the entire thickness of layer 103, and stops within substrate 101. The anode region of diode D2 is formed by substrate 101 and the cathode region of diode D2 is formed by the portion of layer 103 laterally surrounded by insulating wall 125.

In the shown example, device 100 further comprises, in an upper portion of the cathode region diode D1, a heavily-doped N-type contacting area 127 and, in an upper portion of the cathode region of diode D2, a heavily-doped N-type contacting area 129. Each of areas 127 and 129 extends vertically from the upper surface of layer 103 across a thickness smaller than the thickness of layer 103. Areas 127 and 129, for example, substantially have the same depth and the same doping level.

Device 100 of FIG. 1 further comprises an insulating passivation layer 131, for example, made of silicon oxide, coating the upper surface of layer 103. In this example, passivation layer 131 is arranged on top of and in contact with the upper surface of layer 103 and on top of and in contact with the upper surface of insulating walls 119, 121, 123, and 125. Passivation layer 131 comprises a plurality of local through openings allowing for the making of electric contacts to different semiconductor regions of the device. More particularly, layer 131 comprises an opening located opposite a portion of the upper surface of contacting area 127, an opening located opposite a portion of the upper surface of contacting area 129, an opening located opposite a portion of the upper surface of well 107, an opening located opposite a portion of the upper surface of well 113, an opening located opposite a portion of the upper surface of region 111 and a portion which is not occupied by region 111 of the upper surface of well 109, and an opening located opposite a portion of the upper surface of region 117 and a portion which is not occupied by region 117 of the upper surface of well 115.

Device 100 further comprises, on the upper surface side of passivation layer 131, a first metallization 133 in contact with the exposed portions of the upper surface of P-type well 107 and of N-type area 129, a second metallization 135 in contact with the exposed portions of the upper surface of P-type well 109 and of N-type region 111, a third metallization 137 in contact with the exposed portions of the upper surface of P-type well 115 and of N-type region 117, and a fourth metallization 139 in contact with the exposed portions of the upper surface of P-type well 113 and of N-type area 127. Metallizations 133 and 137 are connected to connection terminal IO1 of the device, and metallizations 135 and 139 are connected to connection terminal IO2 of the device.

The P-type doping level of substrate 101 is, for example, in the range from $9*10^{18}$ to $5*10^{19}$ atoms/cm$^3$. The N-type doping level of layer 103 is, for example, in the range from $5*10^{13}$ to $2*10^{14}$ atoms/cm$^3$. The N-type doping level of buried region 105 is, for example, in the range from $1*10^{18}$ to $1*10^{19}$ atoms/cm$^3$. The P-type doping level of wells 107, 109, 113, and 115 is, for example, in the range from $1*10^{18}$ to $1*10^{19}$ atoms/cm$^3$. The N-type doping level of regions 111 and 117 is, for example, in the range from $5*10^{18}$ to $5*10^{19}$ atoms/cm$^3$. The thickness of substrate 101 is for example in the range from 40 to 300 µm. The thickness of layer 103 is, for example, in the range from 5 to 15 µm. The thickness of buried region 105 is, for example, in the range from 2 to 5 µm. The thickness of wells 107, 109, 113, to 115 is, for example, in the range from 1 to 3 µm. The thickness of regions 111, 117, 129, and 127 is, for example, in the range from 0.5 to 2.5 µm.

The operation of device 100 of FIG. 1 will now be described.

The case of an electrostatic discharge resulting in a positive overvoltage peak between terminals IO1 and IO2 of device 100, for example, an electrostatic discharge such as defined by standard IEC 61000, part 4-2 or part 4-5, or by one of the models from among the HBM (Human Body Model) model, the MM (Machine Model) model, and the CDM (Charged Device Model) model is here considered.

As soon as the overvoltage reaches the avalanche threshold of Zener diode DZ1, for example, in the range from 5 to 20 volts, for example in the order of 7 volts, a current flows from terminal IO1 to terminal IO2 through metallization 133, P-type well 107, Zener diode DZ1, substrate 101, diode D1, contacting area 127, and metallization 139. The conduction path, also called the starting path, is illustrated by an arrow 141 in FIG. 1. The starting current causes the turning on of thyristor SCR1 which then dissipates all the current due to the overvoltage.

In case of a negative overvoltage between terminals IO1 and IO2 of device 100, the operation is similar, with the difference that the starting path runs through metallization 139, P-type well 113, Zener diode DZ2, substrate 101, diode D2, contacting area 129, and metallization 133. The starting current causes the tuning on of thyristor SCR2, which then dissipates all the current due to the overvoltage.

A limitation of device 100 of FIG. 1 is that, during the turn-on phase of thyristor SCR1 or SCR2, a parasitic current flows through terminals IO1 and IO2 without flowing through Zener diode DZ1 or DZ2. This current corresponds, in the case of a positive overvoltage, to a leakage current of the lateral PNP transistor formed by well 107, layer 103, and well 109 and, in the case of a negative overvoltage, to a leakage current of the lateral PNP transistor formed by well 113, layer 103, and well 115. This parasitic conduction path is illustrated by an arrow 143 in FIG. 1 (in the case of a positive overvoltage). The parasitic current delays the crossing of the avalanche threshold of Zener diode DZ1 or DZ2, and thus the turning on of thyristor SCR1 or SCR2. In other words, the parasitic current causes an increase in the time necessary to turn on the protection device in the occurrence of an overvoltage.

Figure 2:
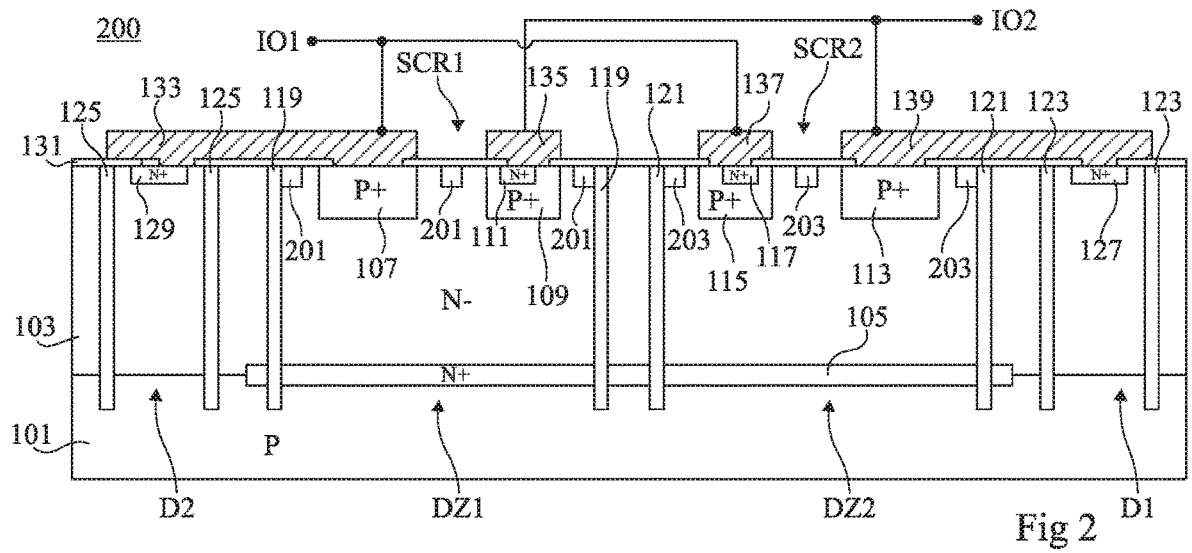
FIG. 2 is a simplified cross-section view of an example of a device of protection against electrostatic discharges.

FIG. 2 is a simplified cross-section view of an example of a device 200 of protection against electrostatic discharges.

Device 200 of FIG. 2 comprises elements common with device 100 of FIG. 1. These common elements will not be detailed again hereafter. In the rest of the description, only the differences with respect to device 100 of FIG. 1 will be highlighted.

Device 200 of FIG. 2 differs from device 100 of FIG. 1 mainly in that it further comprises, in an upper portion of the portion of layer 103 laterally delimited by insulating wall 119, a first heavily-doped N-type stop channel region 201, separating the P-type well 107 of thyristor SCR1 from the P-type well 109 of the same thyristor SCR1. The stop channel region extends vertically from the upper surface of layer 103 down to a depth smaller than the thickness of layer 103, for example, down to a depth smaller than the depth of wells 107 and 109. The doping level of stop channel region 201 is for example in the range from $5*10^{18}$ to $5*10^{19}$ atoms/cm$^3$. The depth of stop channel region 201 is for example in the range from 10 to 80% of the depth of the P type wells 107 and 109. As an example, stop channel region 201 has substantially the same depth and the same doping level as N-type regions 111 and 117 and/or as N-type regions 127 and 129.

Stop channel region 201 is, for example, separate from P-type wells 107 and 109. As an example, stop channel region 201 has, in top view, the shape of two adjacent rings totally surrounding respectively well 107 and well 109. Thus, in top view, stop channel region 201 not only laterally separates well 107 from well 109, but further laterally separates each of wells 107 and 109 from vertical insulating wall 119.

Stop channel region 201 is, for example, left floating, that is, not connected to a connection metallization of the device. In the shown example, the upper surface of stop channel region 201 is in contact with the lower surface of passivation layer 131 over the entire upper surface of stop channel region 201.

Device 200 of FIG. 2 further comprises, in an upper portion of the portion of layer 103 laterally delimited by insulating wall 121, a second heavily-doped N-type stop channel region 203, separating the P-type well 113 of thyristor SCR2 from the P-type well 115 of the same thyristor SCR2. Stop channel region 203, for example, substantially has the same depth and the same doping level as stop channel region 201.

Stop channel region 203 is, for example, separate from P-type wells 113 and 115. As an example, stop channel region 203 has, in top view, the shape of two adjacent rings totally surrounding respectively well 113 and well 115. Thus, in top view, stop channel region 203 not only laterally separates well 113 from well 115, but further laterally separates each of wells 113 and 115 from vertical insulating wall 121.

Stop channel region 203 is, for example, left floating, that is, not connected to a connection metallization of the device. In the shown example, the upper surface of stop channel region 203 is in contact with the lower surface of passivation layer 131 over the entire upper surface of stop channel region 203.

Stop channel region 201 enables, as compared with device 100 of FIG. 1, to decrease the gain of the lateral PNP transistor formed between well 107, layer 103, and well 109. In case of a positive overvoltage between terminals IO1 and IO2 of the device, the parasitic current flowing in the transistor during the device starting phase (parasitic conduction path 143 of FIG. 1) is thereby decreased. The turn-on threshold of Zener diode DZ1 is thus reached faster. This enables to decrease the time of triggering of the protection with respect to the device of FIG. 1.

Similarly, stop channel region 203 enables to decrease the gain of the lateral PNP transistor formed between well 113, layer 103, and well 115, and thus to decrease the time of triggering of the protection in the occurrence of a negative overvoltage between connection terminals IO1 and IO2 of the device.

Figure 3:
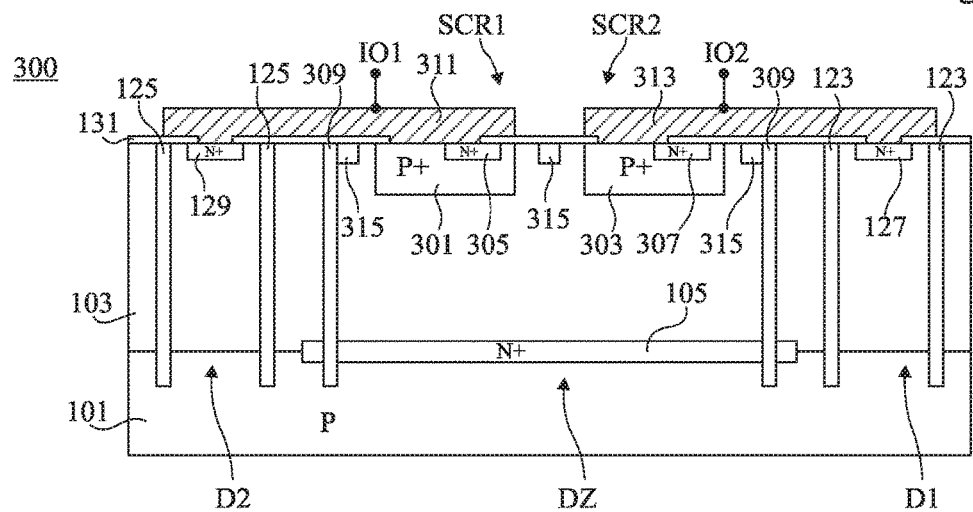
FIG. 3 is a simplified cross-section view of an example of a device of protection against electrostatic discharges.

FIG. 3 is a simplified cross-section view of an example of a device 300 of protection against electrostatic discharges.

Device 300 of FIG. 3 comprises elements common with device 200 of FIG. 2. These common elements will not be detailed again hereafter. In the rest of the description, only the differences with respect to device 200 of FIG. 2 will be highlighted.

Device 300 of FIG. 3 differs from device 200 of FIG. 2 mainly in that, in device 300, the P-type wells of thyristors SCR1 and SCR2 are put in common, which enables to do away with two of the four P-type wells of the structure of FIG. 2.

More particularly, in device 300 of FIG. 3, P-type wells 107, 109, 113, and 115 and N-type regions 111 and 117 of the device of FIG. 2 are replaced with two local P-type wells 301 and 303 formed in an upper portion of layer 103, and two local N-type regions 305 and 307 respectively formed in an upper portion of well 301 and in an upper portion of well 303. P-type wells 301 and 303 are separate. Each well extends vertically from the upper surface of layer 103 across a thickness smaller than the thickness of layer 103. Wells 301 and 303 for example substantially have the same depth and the same doping level as wells 107, 109, 113, and 115 of device 200 of FIG. 2. Wells 301 and 303 are arranged opposite (vertically in line with) buried region 105. N-type region 305 extends laterally over a portion only of the surface of well 301, and extends vertically from the upper surface of well 301, across a thickness smaller than the thickness of well 301. Similarly, N-type region 307 extends laterally over a portion only of the surface of well 303, and extends vertically from the upper surface of well 303, across a thickness smaller than the thickness of well 303. Regions 305 and 307 for example substantially have the same depth and the same doping level as regions 111 and 117.

Lateral thyristor SCR1 is a PNPN-type thyristor formed by P-type well 301, layer 103, P-type well 303, and N-type region 307. The anode region of thyristor SCR1 corresponds to P-type well 301 and the cathode region of thyristor SCR1 corresponds to N-type region 307.

Lateral thyristor SCR2 is a PNPN-type thyristor formed by P-type well 303, layer 103, P-type well 301, and N-type region 305. The anode region of thyristor SCR2 corresponds to P-type well 303 and the cathode region of thyristor SCR2 corresponds to N-type region 305.

In this example, thyristors SCR1 and SCR2 are not laterally separated from each other by a vertical insulating wall. In other words, no vertical insulating wall extends between wells 301 and 303 of the device. The assembly comprising thyristors SCR1 and SCR2 is however totally laterally surrounded with a vertical insulating wall 309, which replaces insulating walls 119 and 121 of the device of FIG. 2. Insulating wall 309 is, for example, made of silicon oxide. In this example, insulating wall 309 extends vertically from the upper surface of layer 103, crosses the entire thickness of layer 103 and of region 105, and stops in substrate 101. In this example, region 105 extends laterally under the entire surface of the portion of layer 103 laterally delimited by insulating wall 309.

The portion of buried region 105 laterally delimited by insulating wall 309 forms with substrate 101 a PN junction defining a Zener diode DZ. The anode region of Zener diode DZ is formed by substrate 101 and the cathode region of Zener diode DZ is formed by the portion of region 105 laterally delimited by insulating wall 309.

Like device 200 of FIG. 2, device 300 of FIG. 3 further comprises, in a peripheral region where buried region 105 is not present, two diodes D1 and D2 defined by the PN junction between substrate 101 and layer 103. As in the example of FIG. 2, diode D1 is laterally delimited by a vertical insulating wall 123 and diode D2 is laterally delimited by a vertical insulating wall 125. Wall 123 laterally separates diode D1 from thyristors SCR1 and SCR2 and from diode D2, and wall 125 laterally separates diode D2 from thyristors SCR1 and SCR2 and from diode D1. In the shown example, device 300 further comprises, as in the example of FIG. 2, in an upper portion of the cathode region of diode D1, a heavily-doped N-type contacting area 127 and, in an upper portion of the cathode region of diode D2, a heavily-doped N-type contacting area 129.

As in the example of FIG. 2, device 300 of FIG. 3 further comprises an insulating passivation layer 131, for example, made of silicon oxide, coating the upper surface of layer 103. In this example, passivation layer 131 is arranged on top of and in contact with the upper surface of layer 103 and on top of and in contact with the upper surface of insulating walls 309, 121, 123, and 125. Passivation layer 131 comprises a plurality of local through openings allowing the recovery of electric contacts on different semiconductor regions of the device. More particularly, layer 131 comprises an opening located opposite a portion of the upper surface of contacting area 127, an opening located opposite a portion of the upper surface of contacting area 129, an opening located opposite a portion of the upper surface of region 305 and a portion which not occupied by region 305 of the upper surface of well 301, and an opening located opposite a portion of the upper surface of region 307 and a portion which is not occupied by region 307 of the upper surface of well 303.

Device 300 of FIG. 3 further comprises, on the upper surface side of passivation layer 131, a first metallization 311 in contact with the exposed portions of the upper surface of P-type well 301, of N-type region 305, and of N-type area 129, and a second metallization 313 in contact with the exposed portions of the upper surface of P-type well 303, of N-type region 307, and of N-type area 127. Metallizations 311 and 313 are respectively connected to connection terminals IO1 and IO2 of the device.

Device 300 of FIG. 3 further comprises, in an upper portion of the portion of layer 103 laterally delimited by insulating wall 309, a heavily-doped N-type stop channel region 315 replacing stop channel regions 201 and 203 of device 200 of FIG. 2. In top view, stop channel region 315 laterally separates P-type well 301 from P-type well 303. Stop channel region 315 extends vertically from the upper surface of layer 103 down to a depth smaller than the thickness of layer 103, for example, down to a depth smaller than the depth of wells 301 and 303. Stop channel region 315 for example has substantially the same depth and the same doping level as stop channel regions 201 and 203 of device 200 of FIG. 2.

Stop channel region 315 is, for example, separate from P-type wells 301 and 303. As an example, stop channel region 315 has, in top view, the shape of two adjacent rings totally surrounding, respectively, well 301 and well 303. Thus, in top view, stop channel region 315 not only laterally separates well 301 from well 303, but further laterally separates each of wells 301 and 303 from vertical insulating wall 309.

Stop channel region 315 is, for example, left floating, that is, not connected to a connection metallization of the device. In the shown example, the upper surface of stop channel region 315 is in contact with the lower surface of passivation layer 131 over the entire upper surface of stop channel region 315.

The operation of device 300 of FIG. 3 is similar to that of device 200 of FIG. 2.

More particularly, in the occurrence of an electrostatic discharge causing a positive overvoltage peak between terminals IO1 and IO2 of device 300, as soon as the overvoltage reaches the avalanche threshold of Zener diode DZ, a current flows from terminal IO1 to terminal IO2 through metallization 311, P-type well 301, Zener diode DZ, substrate 101, diode D1, contacting area 127, and metallization 313. This starting current causes the turning on of thyristor SCR1 which then dissipates all the current due to the overvoltage. In case of a negative overvoltage between terminals IO1 and IO2, the operation is similar, with the difference that the starting path runs through metallization 313, P-type well 303, Zener diode DZ, substrate 101, diode D2, contacting area 129, and metallization 311. The starting current causes the tuning on of thyristor SCR2 which then dissipates all the current due to the overvoltage.

Similarly to what has been described in relation with FIG. 2, stop channel region 315 enables to limit the gain of the lateral PNP transistor formed between well 301, layer 103, and well 303, which enables to decrease the time of triggering of the protection in the occurrence of a positive or negative overvoltage between terminals IO1 and IO2 of the device.

As compared with device 200 of FIG. 2, device 300 of FIG. 3 further has the advantage of being more compact due to the suppression of two P-type wells and of one lateral insulating wall.

In the example of FIG. 3, device 300 comprises a unique P type well 301 and a unique N type region 305 connected to terminal IO1, and a unique P type well 303 and a unique N type region 307 connected to terminal IO2. In top view, wells 301 and 303 and regions 305 and 307 have the shape of elongated strips, for example rectangular, parallel to each other. Well 301 and region 305 form together a first finger connected to terminal IO1 through metallization 311, and well 303 and region 307 form together a second finger connected to metallization 313.

Figure 4:
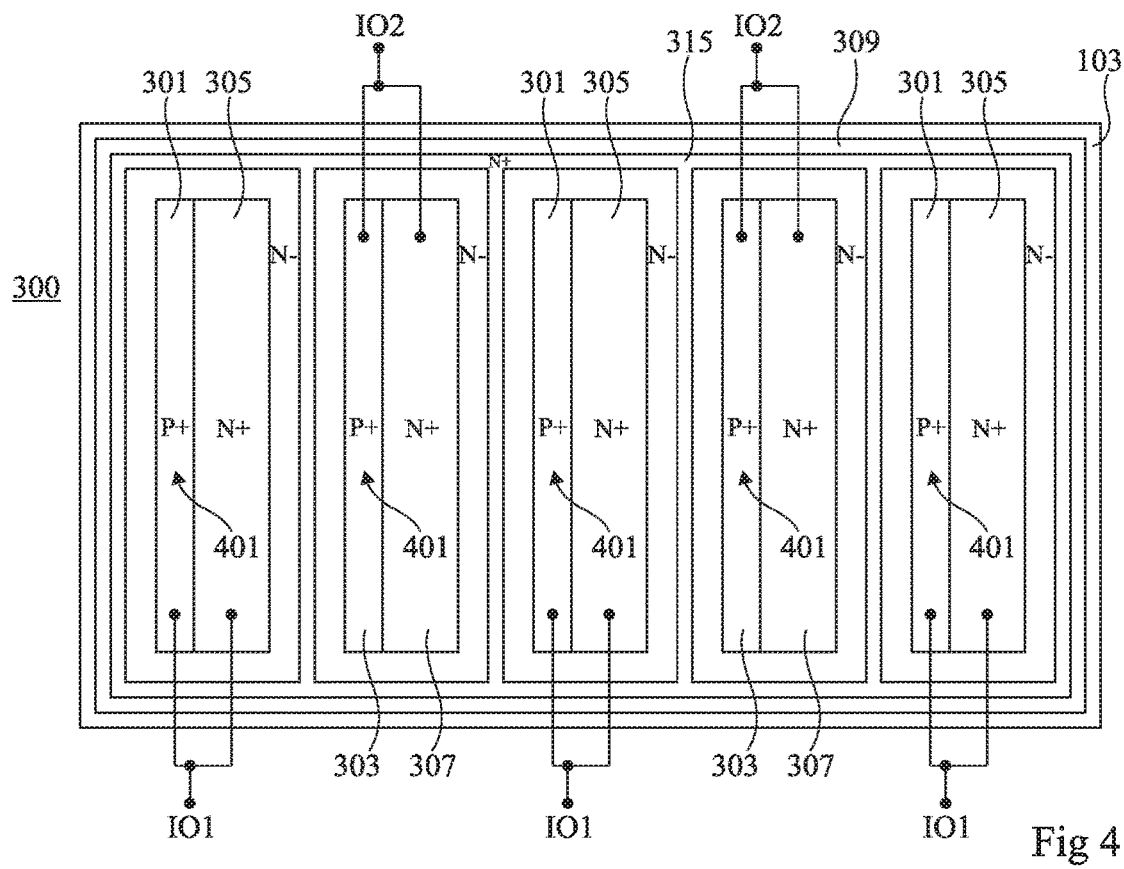
FIG. 4 is a simplified top view of a variant of the device of FIG. 3.

In order to improve robustness, facilitate triggering and/or symmetrize the behavior of the protection, the device may comprise several first fingers and/or several second fingers, interdigitated, as illustrated in FIG. 4 for example.

FIG. 4 is a top view illustrating an example of an interdigitated device, comprising alternating first fingers connected to terminal IO1 and second fingers connected to terminal IO2 (three first fingers and two second fingers in the example shown). For clarity purpose, metallizations 311, 313, diodes D1, D2, insulating walls 123 and 125, and passivation layer 131 have not been shown on FIG. 4.

In the example of FIG. 4, in top view, the stop channel region 315 completely surrounds the P type wells 301 and 303, and laterally separates the wells 301 and 303 one from each other. The insulating peripheral wall 309 completely surrounds the P type wells 301 and 303 and the stop channel region 315, but does not separate laterally the wells 301 and 303 one from each other.

In the example of FIG. 4, each finger of the protection device comprises an emitter shorting strip 401, formed by a portion of the P type well 301, respectively 303, of the finger not covered by the N type region 305, respectively 307, and connected to metallization 311, respectively 313 (not shown on FIG. 4), of connection of the finger to terminal IO1, respectively IO2. In top view, the emitter shorting strips 401 are parallel to the strips formed by the P type wells 301, 303 and by the N type regions 305, 307. Each emitter shorting strip 401 extends along substantially the whole length of well 301, respectively 303 of the finger, along a long side of the well. In the device of FIG. 4, the emitter shorting strips 401 are all located on the same side of wells 301 and 303, the left side in the orientation of FIG. 4.

Figure 5:
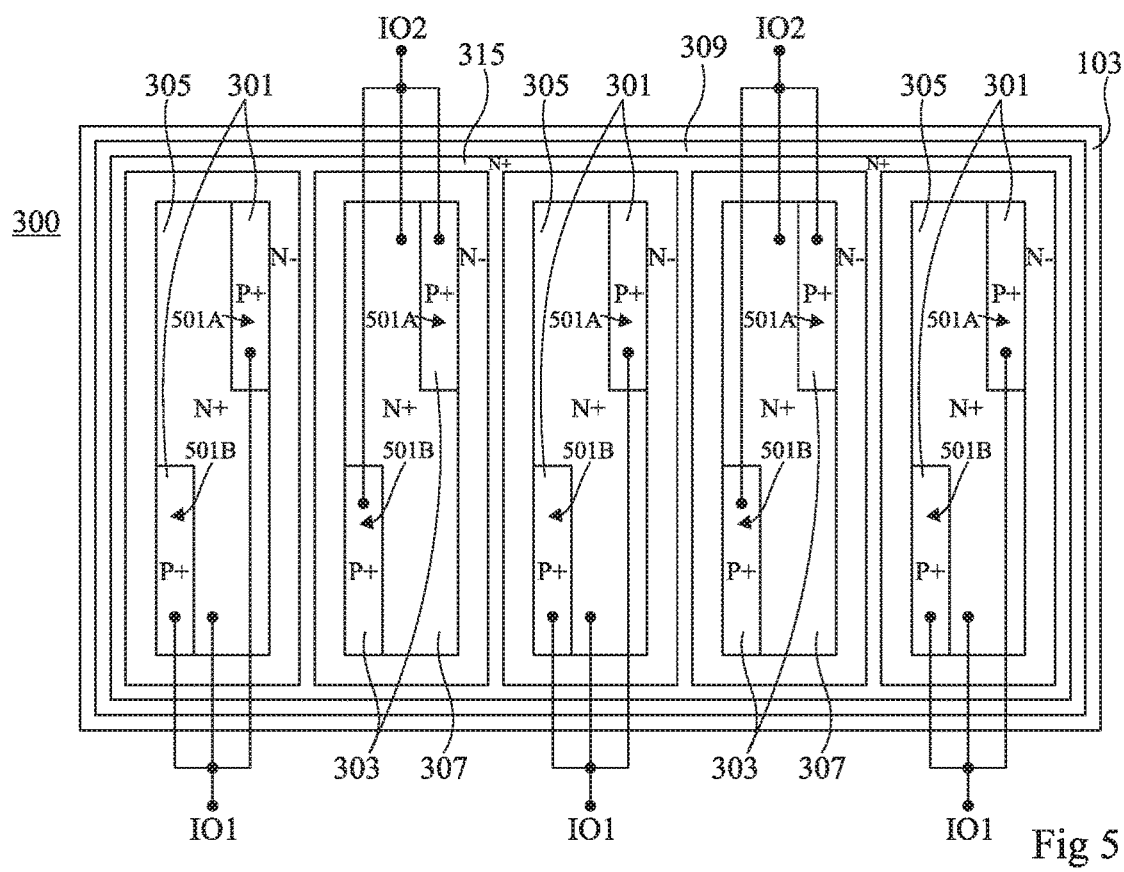
FIG. 5 is a simplified top view of another variant of the device of FIG. 3.

FIG. 5 is a top view illustrating a variant of the device of FIG. 4. The variant of FIG. 5 provides further symmetrizing of the behavior of the protection, and increases the semiconductor surface actually used for surge protection.

In the device of FIG. 5, each finger of the protection device comprises, replacing the emitter shorting strip 401 of FIG. 4, two separated emitter shorting strips 501A and 501B, each extending along substantially half of the length of the P type well 301, respectively 303 of the finger. Strip 501A is located along a first side of the P well of the finger, the right side in the orientation of FIG. 5, and extends in a first half of the length of the well, the upper half in the orientation of FIG. 5. Strip 501B is located along an opposite side of the P well of the finger, the left side in the orientation of FIG. 5, and extends in the second half of the length of the well, the lower half in the orientation of FIG. 5.

Figure 6:
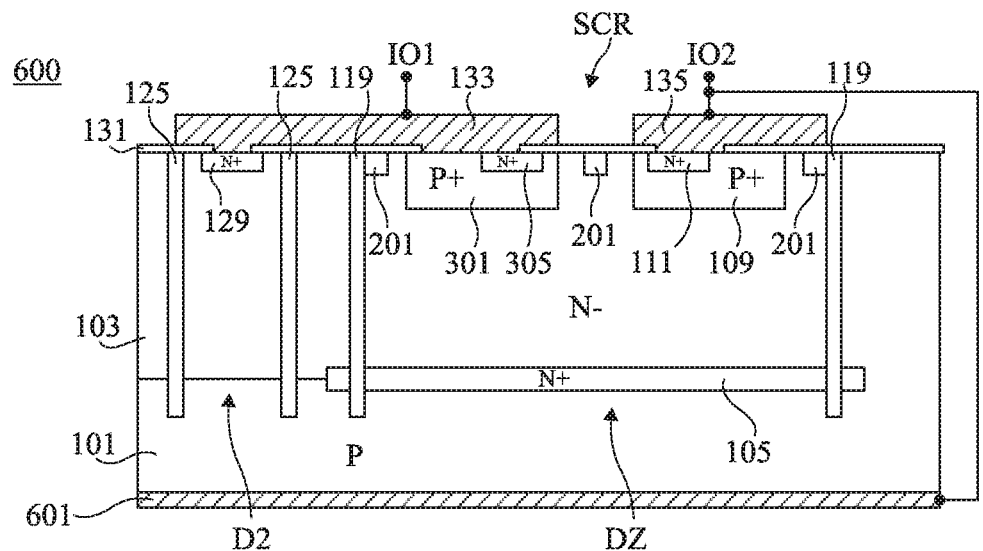
FIG. 6 is a simplified cross-section view of an example of a device of protection against electrostatic discharges.

FIG. 6 is a simplified cross-section view of an example of a device 600 of protection against electrostatic discharges.

Device 600 comprises elements common with device 200 of FIG. 2. These common elements will not be detailed again hereafter. In the rest of the description, only the differences with respect to device 200 of FIG. 2 will be highlighted.

Device 600 of FIG. 6 differs from device 200 of FIG. 2 mainly in that it is unidirectional, that is, it is capable of dissipating positive and negative overvoltages that may occur between its terminals IO1 and IO2, but that it is intended, in normal operation (in the absence of overvoltage), to only receive positive voltages between its terminals IO1 and IO2.

More particularly, device 600 of FIG. 6 comprises a single thyristor SCR, corresponding to thyristor SCR1 of device 200 of FIG. 2, a single Zener diode DZ, corresponding to Zener diode DZ1 of device 200 of FIG. 2, and a single diode D, corresponding to diode D2 of device 200 of FIG. 2. In particular, device 600 of FIG. 6 does not comprise the P-type wells 113 and 115, N-type regions 117 and 127, stop channel region 203, lateral insulating walls 121 and 123, and metallizations 137 and 139 of device 200 of FIG. 2. Device 600 of FIG. 6, however, comprises a connection metallization 601 arranged on top of and in contact with the rear surface of substrate 101 and connected to the same connection terminal IO2 as metallization 135.

In the occurrence of an electrostatic discharge causing a positive overvoltage peak between terminals IO1 and IO2 of device 600, as soon as the overvoltage reaches the avalanche threshold of Zener diode DZ, a current flows from terminal IO1 to terminal IO2 through metallization 133, P-type well 107, Zener diode DZ, substrate 101, and metallization 601. This starting current causes the turning on of thyristor SCR which then dissipates all the current due to the overvoltage.

In the occurrence of a negative overvoltage between terminals IO1 and IO2 of device 600, the overvoltage is directly dissipated by diode D.

As in the example of FIG. 2, stop channel region 201 enables, in the occurrence of a positive overvoltage, to decrease the gain of the lateral PNP transistor formed between well 107, layer 103, and well 109, and thus to decrease the protection triggering time.

Figure 7:
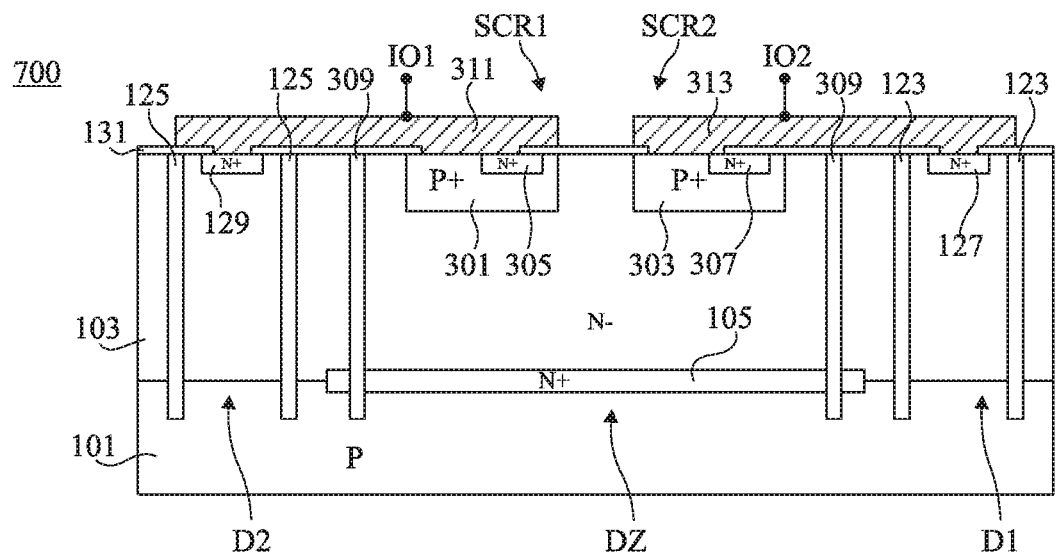
FIG. 7 is a simplified cross-section view of an example of a device of protection against electrostatic discharges.

FIG. 7 is a simplified cross-section view of an example of a device 700 of protection against electrostatic discharges.

Device 700 of FIG. 7 comprises elements common with device 300 of FIG. 3. These common elements will not be detailed again hereafter. In the rest of the description, only the differences with respect to device 300 of FIG. 3 will be highlighted.

As in device 300 of FIG. 3, thyristors SCR1 and SCR2 of device 700 share the same two P-type wells 301 and 303. However, device 700 of FIG. 7 differs from device 300 of FIG. 3 in that, in device 700 of FIG. 7, the stop channel region 315 of device 300 of FIG. 3 is not present. Hence, in device 700, the P-type wells 301 and 303 are laterally separated only by a portion of layer 103.

As compared with device 300 of FIG. 3, device 700 of FIG. 7 does not have the advantage of an improved triggering provided by the stop channel region 315. However, as compared with device 100 of FIG. 1, device 700 of FIG. 7 has the advantage of being more compact due to the suppression of two P-type wells and of one lateral insulating wall.

The embodiment of FIG. 7 may be adapted to the variants of FIGS. 4 and 5. In other words, the stop channel region 315 of the devices 300 of FIGS. 4 and 5 may be omitted.

Various embodiments and variations have been described. Those skilled in the art will understand that certain features of these various embodiments and variations may be combined, and other variations will occur to those skilled in the art. In particular, the described embodiments are not limited to the examples of dimensions and of doping levels mentioned in the present disclosure.

Further, in the above-described examples of protection devices, all the conductivity types may be inverted.

The invention claimed is:

1. A device of protection against electrostatic discharges, comprising:
    a semiconductor substrate of a first conductivity type coated with a semiconductor layer of the second conductivity type;
    a buried region of the second conductivity type located at an interface between the semiconductor substrate and the semiconductor layer and having a doping level greater than a doping level of the semiconductor layer;
    first and second wells of the first conductivity type formed in the semiconductor layer on a side of its surface opposite to the semiconductor substrate;
    a region of the second conductivity type formed in the second well on a side of its surface opposite to the semiconductor substrate; and
    a first stop channel region of the second conductivity type having a doping level greater than the doping level of the semiconductor layer, the first stop channel formed in the semiconductor layer on the side of its surface opposite to the semiconductor substrate at a location laterally between the first and second wells, wherein the first stop channel is not in direct contact with either the first well or the second well;
    wherein the first well is electrically connected to a first connection terminal of the device and wherein the second well and the region of the second conductivity type formed in the second well are electrically connected to a second connection terminal of the device.

2. The device of claim 1, wherein, in top view, the first stop channel region totally surrounds each of the first and second wells.

3. The device of claim 1, further comprising a first vertical insulating wall surrounding, in top view, the first stop channel region and the first and second wells, the first vertical insulating wall extending across an entire thickness of the semiconductor layer and across an entire thickness of the buried region.

4. The device of claim 1, further comprising, in a portion of the device which does not comprise the buried region, a second vertical insulating wall laterally delimiting a first diode defined by a junction between the semiconductor substrate and the semiconductor layer.

5. The device of claim 4, wherein a portion of the semiconductor layer laterally delimited by the second vertical insulating wall is electrically connected to the second connection terminal of the device via a contacting area.

6. The device of claim 4, wherein a portion of the semiconductor layer laterally delimited by the second vertical insulating wall is electrically connected to the first connection terminal of the device via a contacting area, and wherein the semiconductor substrate is electrically connected to the second connection terminal of the device.

7. The device of claim 1, further comprising:
third and fourth wells of the first conductivity type formed in the semiconductor layer on the side of its surface opposite to the semiconductor substrate;
a region of the second conductivity type formed in the fourth well on a side of its surface opposite to the semiconductor substrate; and
a second stop channel region of the second conductivity type having a doping level greater than that of the semiconductor layer, the second stop channel region formed in the semiconductor layer on the side of its surface opposite to the semiconductor substrate at a location laterally between the third and fourth wells, wherein the second stop channel is not in direct contact with either the third well or the fourth well;
wherein the third well is electrically connected to the second connection terminal of the device and wherein the fourth well and the region of the second conductivity type formed in the fourth well are electrically connected to the first connection terminal of the device.

8. The device of claim 7, wherein, in top view, the second stop channel region totally surrounds each of the third and fourth wells.

9. The device of claim 7, further comprising a third vertical insulating wall surrounding, in top view, the second stop channel region and the third and fourth wells, the third vertical insulating wall extending across the entire thickness of the semiconductor layer and extending across the entire thickness of the buried region.

10. The device of claim 1, further comprising a region of the second conductivity type formed in the first well on the side of its surface opposite to the semiconductor substrate, and wherein the region of the second conductivity type formed in the first well is electrically connected to the first connection terminal of the device.

11. The device of claim 7, further comprising, in a portion of the device which does not comprise the buried region, a fourth vertical insulating wall laterally delimiting a second diode defined by a junction between the semiconductor substrate and the semiconductor layer.

12. The device of claim 11, wherein a portion of the semiconductor layer laterally delimited by the fourth vertical insulating wall is electrically connected to the first connection terminal of the device via a contacting area.

13. A device of protection against electrostatic discharges, comprising:
a semiconductor substrate of a first conductivity type;
a semiconductor layer of the second conductivity type;
a buried region of the second conductivity type having a doping level greater than a doping level of the semiconductor layer, wherein the buried region is located at an interface between the semiconductor substrate and the semiconductor layer; and;
first and second wells of the first conductivity type formed in the semiconductor layer on a side of its surface opposite to the semiconductor substrate;
a region of the second conductivity type formed in the first well on the side of its surface opposite to the semiconductor substrate;
a region of the second conductivity type formed in the second well on a side of its surface opposite to the semiconductor substrate; and
a stop channel region of the second conductivity type having a doping level greater than the doping level of the semiconductor layer, the stop channel formed in the semiconductor layer on the side of its surface opposite to the semiconductor substrate at a location laterally between the first and second wells and separated from each of the first and second wells a portion of said semiconductor layer;
wherein the first well is electrically connected to a first connection terminal of the device and wherein the second well is electrically connected to a second connection terminal of the device.

14. The device of claim 13:
wherein the region of the second conductivity type formed in the first well is electrically connected to the first connection terminal of the device; and
wherein the region of the second conductivity type formed in the second well is electrically connected to the second connection terminal of the device.

15. A device of protection against electrostatic discharges, comprising:
a semiconductor substrate of a first conductivity type;
a semiconductor layer of the second conductivity type;
a buried region of the second conductivity type having a doping level greater than a doping level of the semiconductor layer, wherein the buried region is located at an interface between the semiconductor substrate and the semiconductor layer; and;
first and second wells of the first conductivity type formed in the semiconductor layer on a side of its surface opposite to the semiconductor substrate; and
a stop channel region of the second conductivity type having a doping level greater than the doping level of the semiconductor layer, the stop channel formed in the semiconductor layer on the side of its surface opposite to the semiconductor substrate at a location laterally between the first and second wells and separated from each of the first and second wells a portion of said semiconductor layer;
wherein the first well is electrically connected to a first connection terminal of the device and wherein the second well is electrically connected to a second connection terminal of the device; and
wherein, in top view, the stop channel region extends to surround each of the first and second wells.

16. The device of claim 13, further comprising a first vertical insulating wall surrounding, in top view, the stop channel region and the first and second wells, wherein said first vertical insulating wall extends completely through both the semiconductor layer and the buried layer.

17. The device of claim 16, further comprising, in a portion of the device which does not comprise the buried region, a second vertical insulating wall the extends completely through the semiconductor layer and into the semiconductor substrate.

18. The device of claim 17, wherein a junction between the semiconductor substrate and the semiconductor layer delimited by the second vertical insulating wall forms a diode.

19. The device of claim 18, wherein a portion of the semiconductor layer laterally delimited by the second vertical insulating wall is electrically connected to the second connection terminal.

20. The device of claim 18, wherein a portion of the semiconductor layer laterally delimited by the second vertical insulating wall is electrically connected to the first connection terminal.

21. The device of claim 13, wherein, in top view, the stop channel region extends to surround each of the first and second wells.

* * * * *

UNITED STATES PATENT AND TRADEMARK OFFICE
CERTIFICATE OF CORRECTION

| | | |
|---|---|---|
| PATENT NO. | : 11,296,071 B2 | Page 1 of 1 |
| APPLICATION NO. | : 16/834499 | |
| DATED | : April 5, 2022 | |
| INVENTOR(S) | : Eric Laconde et al. | |

It is certified that error appears in the above-identified patent and that said Letters Patent is hereby corrected as shown below:

In the Specification

At Column 3, Line 40, please replace the term [[102]] with -- IO2 --.

Signed and Sealed this
Eleventh Day of July, 2023

Katherine Kelly Vidal
*Director of the United States Patent and Trademark Office*